United States Patent
Zwingman et al.

(10) Patent No.: US 7,745,886 B2
(45) Date of Patent: Jun. 29, 2010

(54) SEMICONDUCTOR ON INSULATOR (SOI) SWITCHING CIRCUIT

(75) Inventors: Robert L. Zwingman, Walnut, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 87 days.

(21) Appl. No.: 12/286,472

(22) Filed: Sep. 29, 2008

(65) Prior Publication Data

US 2009/0149213 A1 Jun. 11, 2009

Related U.S. Application Data

(60) Provisional application No. 61/007,035, filed on Dec. 10, 2007.

(51) Int. Cl.
*H01L 31/113* (2006.01)
*H01L 21/336* (2006.01)
(52) U.S. Cl. ................................. 257/401; 438/284
(58) Field of Classification Search ......... 257/393–401, 257/501–504, E29.32; 438/279–286
See application file for complete search history.

(56) References Cited

U.S. PATENT DOCUMENTS 5,789,800 A * 8/1998 Kohno .................. 257/588
6,867,477 B2 * 3/2005 Zheng et al. ............ 257/557

\* cited by examiner

*Primary Examiner*—Calvin Lee
(74) *Attorney, Agent, or Firm*—Farjami & Farjami LLP

(57) ABSTRACT

A disclosed embodiment is a switching circuit including a number of transistors fabricated in a device layer situated over a buried oxide layer and a bulk semiconductor layer. Each transistor has a source/drain junction that does not contact the buried oxide layer, thus forming a source/drain junction capacitance. The disclosed switching circuit also includes at least one trench extending through the device layer and contacting a top surface of the buried oxide layer, thus electrically isolating at least one of the transistors in the switching circuit so as to reduce voltage and current fluctuations in the device layer. The disclosed switching circuit may be coupled to a power amplifier or a low noise amplifier and an antenna in a wireless communications device, and be controlled by a switch control signal in the wireless communications device.

19 Claims, 7 Drawing Sheets

US 7,745,886 B2

SEMICONDUCTOR ON INSULATOR (SOI) SWITCHING CIRCUIT

The present application claims the benefit of and priority to a provisional patent application entitled "Semiconductor on Insulator (SOI) Structure, Method for Fabrication, and Circuits Using Same," Ser. No. 61/007,035 filed on Dec. 10, 2007. The disclosure in that provisional application is hereby incorporated fully by reference into the present application.

BACKGROUND OF THE INVENTION

1. Field of the Invention

The present invention is generally in the field of fabrication of semiconductor structures and circuits. More particularly, the invention is in the field of fabrication of semiconductor on insulator (SOI) structures and circuits.

2. Background Art

Semiconductor structures such as transistors and isolating trenches are conventionally fabricated on several types of silicon wafers. For example, such structures can be fabricated on bulk silicon wafers or silicon on insulator wafers. Bulk silicon wafers typically have a substantially uniform composition, while semiconductor on insulator wafers typically have a layered composition. Once fabricated on a particular silicon wafer, such semiconductor structures are typically used in a wide variety of circuits, including switching circuits.

Each type of silicon wafer utilized for fabricating such semiconductor structures suffers from attendant drawbacks. For example, it is difficult to electrically isolate semiconductor structures fabricated on a conventional bulk silicon wafer, because although such semiconductor structures can be partially electrically isolated by virtue of, for example, their isolating trenches, electric current can still flow under such trenches, leading to, for example, voltage and current fluctuations. Neighboring semiconductor devices, e.g. neighboring cascaded transistors, in such structures thus tend to interfere with one another when fabricated on bulk silicon wafers. In contrast, it is easier to electrically isolate semiconductor structures or circuits implemented on a conventional silicon on insulator wafer, in which a buried oxide layer provides additional isolation. Unfortunately, circuits designed for fabrication in a bulk silicon wafer must be redesigned for fabrication in a conventional silicon on insulator wafer, which significantly increases manufacturing and integration complexity and cost.

Thus, there is a need in the art for semiconductor structures and circuits that overcome disadvantages associated with utilizing conventional bulk silicon and silicon on insulator wafers.

SUMMARY OF THE INVENTION

A semiconductor on insulator (SOI) switching circuit, substantially as shown in and/or described in connection with at least one of the figures, and as set forth more completely in the claims.

DETAILED DESCRIPTION OF THE INVENTION

The present invention is directed to a semiconductor on insulator (SOI) switching circuit. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
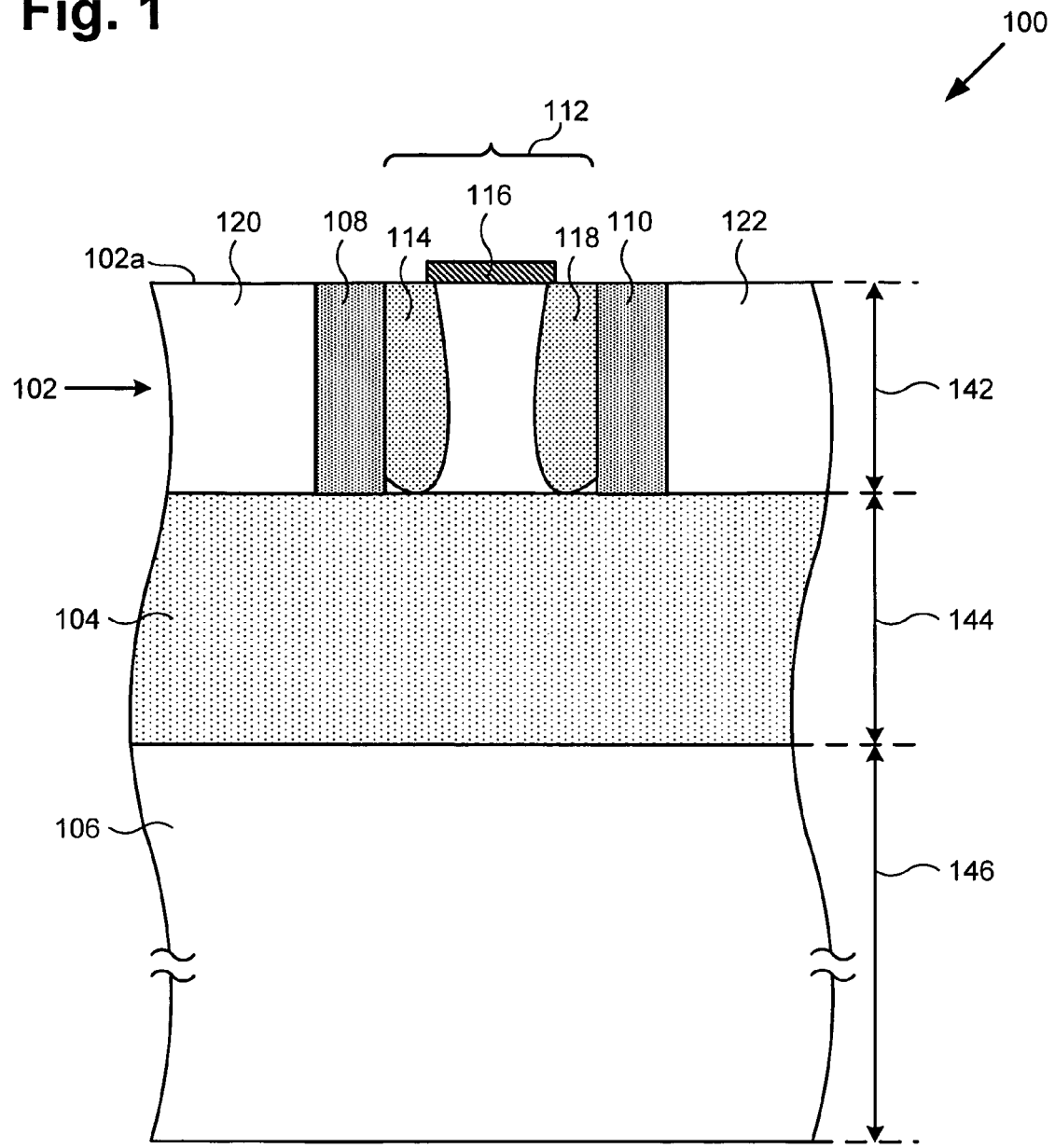
FIG. 1 shows an example of a conventional semiconductor on insulator (SOI) structure.

In FIG. 1, a conventional semiconductor on insulator ("SOI") wafer cross section is shown as structure 100. Structure 100 comprises exemplary device layer 102, buried oxide layer 104, and bulk semiconductor layer 106. Device layer 102 comprises a semiconductor such as, for example, silicon, and has thickness 142, which might be about 800 Angstroms in one embodiment. Buried oxide layer 104, which is situated below device layer 102, is an insulator such as, for example, silicon oxide, and has thickness 144, which might be about 1200 Angstroms in one embodiment. Bulk semiconductor layer 106, which is situated below buried oxide layer 104, has, in one embodiment, a typical resistivity of about 3 to 20 ohms-centimeter, and thickness 146 which might be about 725 microns, and forms the bottom of structure 100.

Device layer 102, buried oxide layer 104, and bulk semiconductor layer 106 of structure 100 can be produced by several methods as known in the art. For example, one method involves growing oxide layers on two silicon wafers, placing the oxide layers in contact with each other, annealing the oxide layers together, and grinding the reverse side of one of the silicon wafers to produce a SOI wafer having a device layer of the desired thickness. Another exemplary method utilizing two silicon wafers involves growing an oxide on one silicon wafer (typically 80% of the resulting buried oxide layer), growing an oxide on the other silicon wafer (typically 20% of the resulting buried oxide layer), implanting hydrogen, placing the two silicon wafers together, and thermally shocking the resulting assembly. The shock cracks one of the silicon wafers, producing a new top surface (e.g., top surface 102a of structure 100) resulting in a SOI wafer of the desired thickness.

Structure 100 also comprises trench 108 and trench 110. To form trenches 108 and 110, the material of device layer 102 situated where trenches 108 and 110 will be formed is removed, e.g. etched away, and LOCOS or STI oxidation processes, for example, are used to fill both trenches with an insulative oxide. Trenches 108 and 110 typically extend through device layer 102 and contact the top surface of buried oxide layer 104, as shown in FIG. 1. In the region, or island, of device layer 102 between trenches 108 and 110 transistor 112 can be fabricated. Transistor 112 (an example of a "semiconductor device" in the present application), is electrically isolated from neighboring islands 120 and 122 by trenches 108 and 110, respectively, and buried oxide layer 104. This isolation is one conventional advantage of building semiconductor structures, such as transistor 112, on a SOI wafer, because the isolation allows such semiconductor structures to experience positive and negative voltage excursions without affecting neighboring devices and without shorting to ground.

Transistor 112 of structure 100 could be, for example, an NFET or a PFET transistor, and comprises source 114, gate 116, and drain 118. Source 114 and drain 118 typically extend all the way through device layer 102 and contact the top surface of buried oxide layer 104. Because there is thus no, or almost no, semiconductor material, e.g. silicon, between source 114 or drain 118 and the top surface of buried oxide layer 104, there is no, or almost no, semiconductor junction to create a capacitive load. Such low capacitance allows for, for example, higher speed operation or lower power consumption. However, such low or non-existent junction capacitance also prevents the utilization of well understood bulk silicon wafer design methodology, device models, and well developed design kits that take into account existence of certain amount of junction capacitance based on, for example, transistor sizes, device geometries and other factors. In other words, conventional SOI structure 100 must be designed and fabricated using only new, less developed, and less prevalent design methodologies, device models and design kits that are not as well developed, tested or understood, and which also introduce additional development costs and inefficiencies in the design and fabrication of SOI devices using conventional SOI structure 100 in FIG. 1.

Conventional structure 100 thus illustrates several advantages and disadvantages of utilizing a conventional SOI wafer instead of a conventional bulk silicon wafer when fabricating certain semiconductor structures, such as transistor 112 and trenches 108 and 110. Building trenches similar to trenches 108 and 110 in a conventional bulk silicon wafer, instead of a conventional SOI wafer as shown in FIG. 1, would not produce effective isolation because semiconductor devices, such as transistor 112, could short out to other devices or electrically communicate under the trenches. However, as discussed above, utilizing a conventional SOI wafer imposes significant design challenges and costs.

Figure 2:
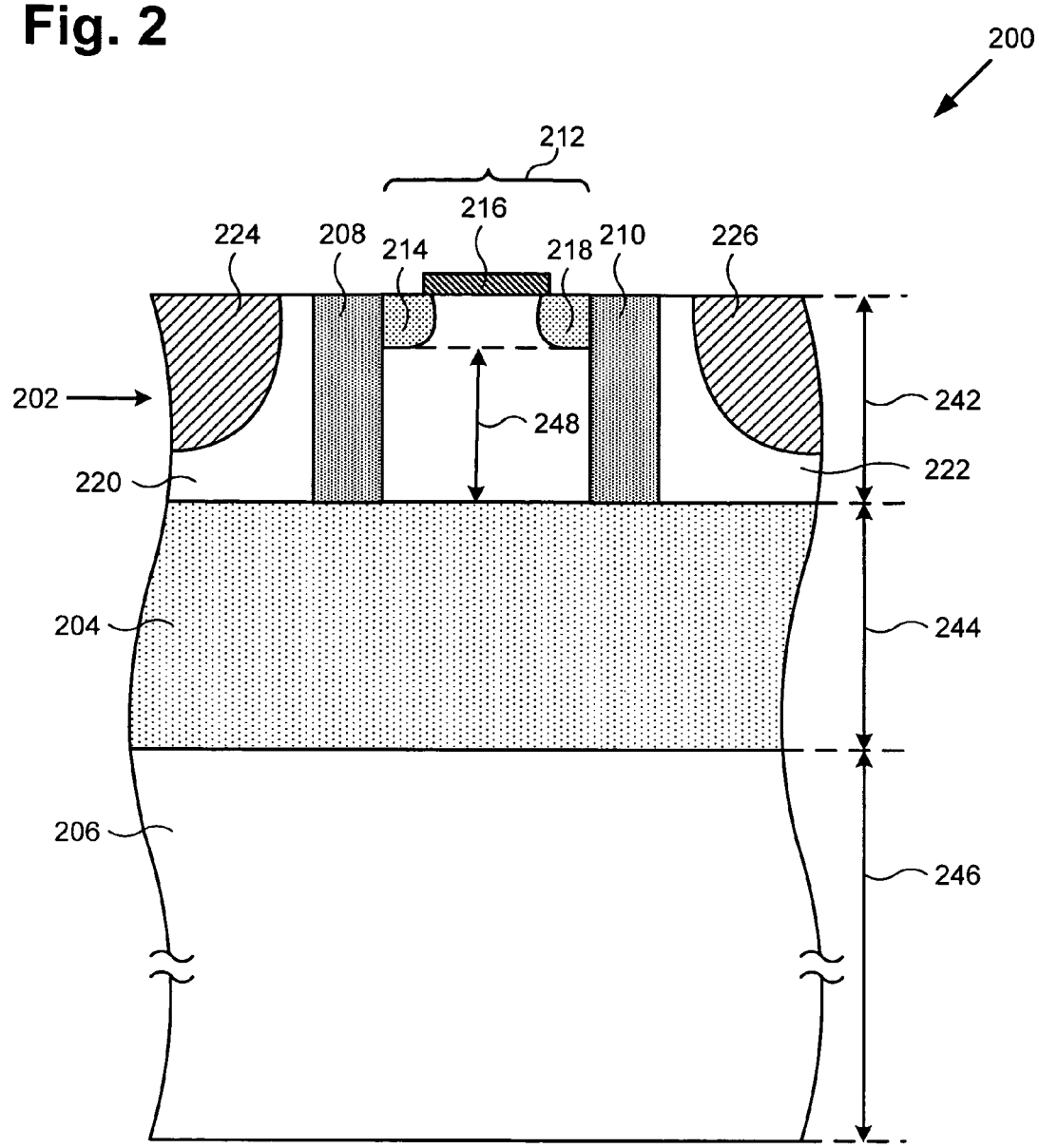
FIG. 2 shows an exemplary SOI structure according to one embodiment of the present invention.

FIG. 2 shows a semiconductor on insulator ("SOI") wafer cross section, according to one embodiment of the present invention, as structure 200. Structure 200 shares certain features with structure 100, and comprises device layer 202, buried oxide layer 204, and bulk semiconductor layer 206. In this embodiment, and by way of examples only, device layer 202 has a thickness 242 of about 1.4 microns. Buried oxide layer 204 is situated below device layer 202, is an insulator such as, for example, silicon oxide, and has a thickness 244 of, for example, about 1 micron. Bulk semiconductor layer 206 is situated below buried oxide layer 204, has a thickness 246 of, for example, about 725 microns, has a resistivity of, for example, about 1000 ohms-centimeter, and forms the bottom of structure 200. Thus, in this embodiment, while the invention's bulk semiconductor layer 206 may have a thickness similar, for example, to conventional bulk semiconductor layer 106, the invention's buried oxide layer 204 and device layer 202 are significantly thicker than respective conventional buried oxide layer 104 and device layer 102. Additionally, the invention's bulk semiconductor layer 206 has a significantly greater resistivity than conventional bulk semiconductor layer 106.

Structure 200 comprises semiconductor devices, such as for example transistor 212, which in one embodiment could be, for example, an NFET or a PFET transistor. Continuing with this example, transistor 212 comprises source 214, gate 216, and drain 218. Because of the increased thickness of device layer 202, source 214 and drain 218 do not extend all the way through device layer 202 to contact the top surface of buried oxide layer 204. Instead, a layer with intervening thickness 248 remains between the bottom surfaces of source 214 and drain 218 and the top surface of buried oxide layer 204. Consequently, a semiconductor junction is formed by source 214 and drain 218 within device layer 202. Each such semiconductor junction will have an associated junction capacitance, e.g. the source/drain junctions of transistor 212 have corresponding source/drain junction capacitances.

The source/drain junction capacitances of transistor 212 behave similarly to the junction capacitances of a transistor implemented in a conventional bulk silicon wafer, instead of a conventional SOI wafer, in part because of the greater thickness of device layer 202 compared to the thickness of conventional device layer 102. The better understood and more predictable junction capacitances in structure 200 result in more predictable behavior of transistor 212 such that, for example, computer simulation programs and bulk silicon wafer design kits that are well understood and widely used for conventional bulk silicon fabrication can be utilized to design and implement transistor 212 in the invention's SOI wafer. Significantly, the behavior of transistor 212 is better understood and more predictable than the behavior of transistor 112 in FIG. 1 which, for example, practically lacks any source or drain junction capacitance because source 114 and drain 118 of transistor 112 extend all the way to the top surface of buried oxide layer 104.

Transistor 212 is electrically isolated from neighboring islands 220 and 222 by adjacent trenches 208 and 210, respectively, and by buried oxide layer 204. In order to achieve this isolation, in one embodiment of the invention trenches 208 and 210 are etched to extend all the way, or almost all the way, through device layer 202 and contact, or almost contact, the top surface of buried oxide layer 204. According to the present invention, a novel process is used to form trenches 208 and 210 after the fabrication of transistor 212, instead of forming the trenches prior to fabrication of transistor 212, as is the case in the fabrication of conventional structure 100. More specifically, to fabricate structure 100, trenches 108 and 110 are etched early in the fabrication process, a thin layer of oxide is grown in each trench, the trenches are coated and lined with more oxide, and then the trenches are filled with polysilicon, as known in the art. In contrast, trenches 208 and 210 are etched during a "backend" process after fabrication of transistor 212 and are filled with a dielectric, which in one embodiment is silicon oxide, and/or some additive, instead of polysilicon.

According to one embodiment of the invention, islands 220 and 222 may have well 224 and well 226, respectively, which cannot be formed in the process used to create SOI structure 100. Wells 224 and 226 may or may not extend all the way through device layer 202, and may or may not contact the top of buried oxide layer 204. The wells, if they exist, can be P-wells or N-wells, depending on the type of semiconductor devices to be placed in island 220 and island 222, if any.

Figure 3:
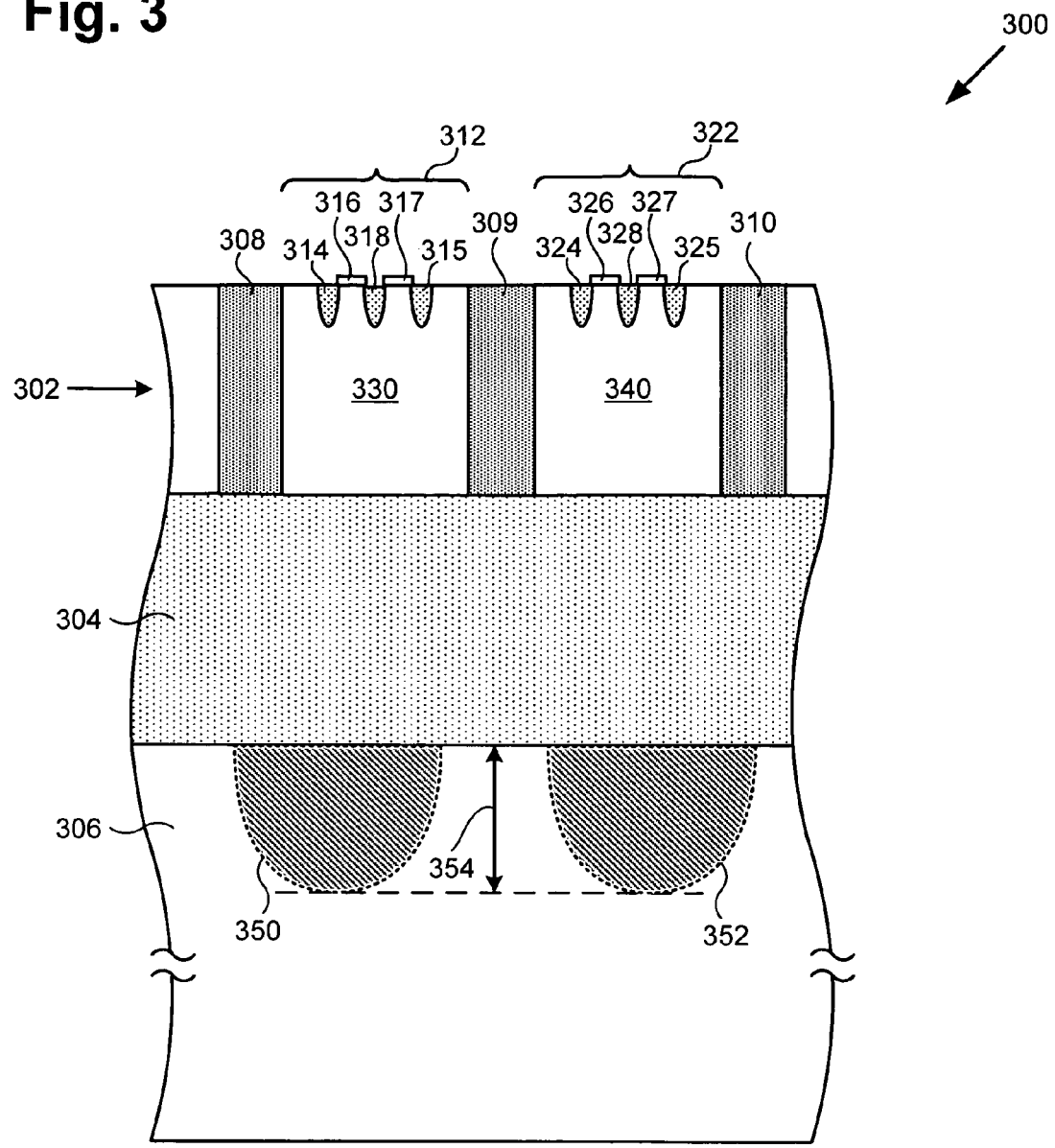
FIG. 3 shows an exemplary SOI structure according to one embodiment of the present invention.

FIG. 3 shows a semiconductor on insulator ("SOI") wafer cross section, according to one embodiment of the present invention, as structure 300. Structure 300 comprises device layer 302, buried oxide layer 304, and bulk semiconductor layer 306, which correspond to device layer 202, buried oxide layer 204, and bulk semiconductor layer 206 of structure 200. Structure 300 also comprises trench 308, trench 309, and trench 310, which correspond to trenches 208 and 210 in structure 200. Additionally, structure 300 comprises transistor 312 and transistor 322, each of which is a semiconductor device corresponding to transistor 212 in structure 200. In one embodiment of the invention, transistors 312 and 322 can exist in neighboring islands 330 and 340 in device layer 302, separated by trench 309 and isolated from other semiconductor devices by trenches 308 and 310 and by buried oxide layer 304.

FIG. 3 illustrates how the combination of the isolation provided by buried oxide layer 304 and by trenches 308, 309, and 310, the greater thickness of device layer 302, and the high resistivity of bulk silicon layer 306 allows for the enhancement and advantages in the design of transistors or other semiconductor devices. Notably, in this configuration transistors 312 and 322 can be "stacked" together, i.e. closely spaced, while remaining electrically isolated to make advantageous circuits, such as various high voltage switching circuits, an embodiment of which is described below.

It is noted that in the configuration of structure 300 in FIG. 3, transistors 312 and 322 each consists of two gates (which might be implemented as a gate with two "fingers," "branches," i.e. as a "partitioned gate"). For example, transistor 312 consists of two gates 316 and 317 (or a gate with two fingers or two branches 316 and 317) that are shorted to each other by a metal interconnect or other interconnect, not shown in any of the Figures. Similarly, transistor 322 consists of two gates 326 and 327 (or a gate with two fingers or two branches 326 and 327) that are shorted to each other by a metal interconnect or other interconnect, not shown in any of the Figures. In some embodiments of the present invention, each transistor may consist of many more gates shorted to each other to represent a single electrical gate.

Each transistor may also consist of one or more drains (or one or more sources), interconnected to result in a single drain (or a single source). For example, transistor 312 is shown as having sources 314 and 315, which are shorted by a low resistivity interconnect not shown. Drain 318 is common between the shorted gates 316, 317, and the shorted sources 314 and 315 of transistor 312. However, in some embodiments more than one drain can be used (i.e. a drain with branches and fingers that are shorted to represent a single electrical drain). Similarly, transistor 322 is shown as having sources 324 and 325, which are shorted by a low resistivity interconnect not shown. Drain 328 is common between the shorted gates 326, 327, and the shorted sources 324 and 325 of transistor 322. However, in some embodiments more than one drain can be used (i.e. a drain with branches and fingers that are shorted to represent a single electrical drain). Various embodiments of the invention's transistors can be used in high voltage circuits, such as high voltage switching circuits, an embodiment of which is described below.

Because of the significantly greater thickness of device layer 302, semiconductor material, e.g. silicon, remains between the bottom surfaces of the sources and drains of transistors 312 and 322 and the top surface of buried oxide layer 304 (such remaining semiconductor corresponds to the semiconductor remaining in thickness 248 in structure 200) in islands 330 and 340. This remaining semiconductor would result in source/drain junction capacitance, similar to the junction capacitance of structure 200 as discussed above.

It should be noted that the effect of the resulting capacitive load from source/drain junction capacitances in structure 200 or structure 300 is advantageously reduced by taking advantage of the thick buried oxide layer 204 or 304 and the high resistivity of bulk silicon layer 206 or 306. For example, the greater thickness of buried oxide layer 304 can reduce the effect of junction capacitances in transistors 312 and 322, and the higher resistivity of bulk semiconductor layer 306 can further reduce such capacitances by facilitating the formation of thick depletion regions 350 and 352, thereby reducing the effect of source/drain junction capacitances loading transistors 312 and 322. Moreover, preserving the advantages of SOI structures, during operation of transistors 312 and 322, islands 330 and 340 can withstand large positive and negative voltage excursions because of the electrical isolation provided by adjacent trenches 308, 309, and 310, and buried oxide layer 304.

Depth 354 of depletion regions 350 and 352 (not drawn to scale), extending from the bottom surface of buried oxide layer 304, might be in one embodiment about 20 microns into bulk semiconductor layer 306, and is much greater than the depth of a corresponding depletion region in conventional bulk semiconductor layer 106 in FIG. 1, which may be, for example, as little as 2 microns or even a tenth of a micron, because conventional structure 100 has a much lower resistivity bulk semiconductor.

Some further advantages of using the invention's SOI structures, such as s transistors 312 and 322, are for example, improved noise isolation and lower power consumption. Also, insertion loss can be reduced, and the "ON" resistance of transistors 312 and 322 is reduced, and in this way intended signals can pass through transistors 312 and 322 and/or can be amplified without being subjected to too much noise and without losing signal strength, thus maintaining a high signal to noise ratio. Moreover, because the entire islands 330 and 340 can experience voltage excursions, the reduced capacitance between islands 330 and 340 and bulk semiconductor layer 306 also reduces the time constant required to charge islands 330 and 340. According to these and other various advantages of the invention, transistors 312, 322, and additional transistors according to various embodiments can be used to design advantageous high voltage circuits, such as high voltage switching circuits, that exhibit reduced voltage and current fluctuations in device layer 302.

Figure 4:
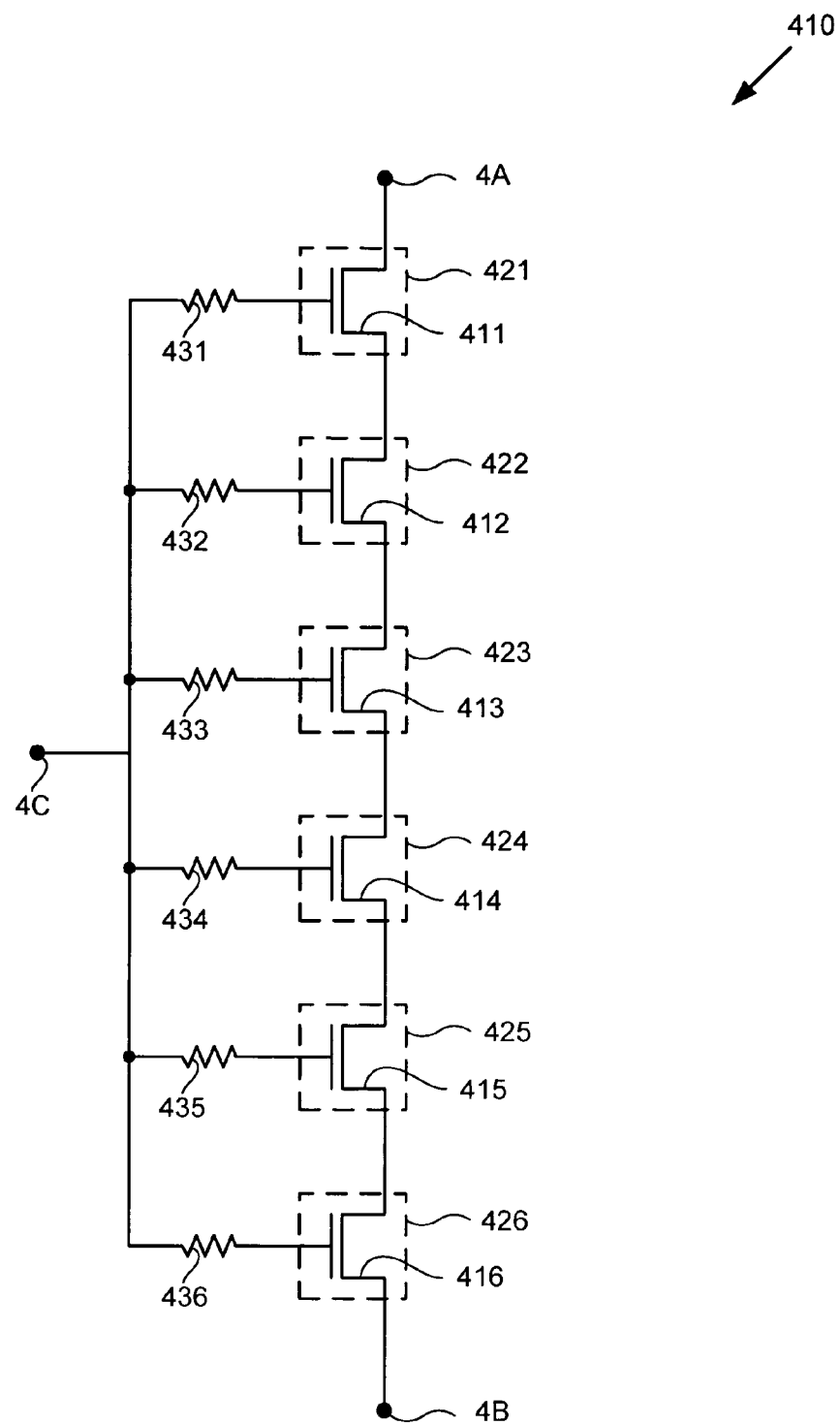
FIG. 4 shows an exemplary SOI switching circuit according to one embodiment of the present invention.

FIG. 4 shows exemplary switching circuit 410, according to one embodiment of the present invention. Switching circuit 410 comprises a plurality of cascaded transistors 411, 412, 413, 414, 415, and 416 ("transistors 411 through 416"), and resistors 431, 432, 433, 434, 435, and 436 ("resistors 431 through 436"). Transistors 411 through 416 are fabricated in islands 421, 422, 423, 424, 425, and 426 ("islands 421 through 426") respectively, and coupled in series, or cascaded, as shown in FIG. 4. Transistors 411 through 416 are fabricated according to one embodiment of the present invention. For example, each transistor might have a structure corresponding to exemplary transistor 312 in FIG. 3 or to exemplary transistor 212 in FIG. 2. While in the present embodiment of switching circuit 410, transistors 411 through 416 are NFET transistors, in another embodiment transistors 411 through 416 might be PFET transistors. In one embodiment, each island 421 through 426 might have a structure corresponding to exemplary island 330 in FIG. 3. While FIG. 3 depicts exemplary island 330 in cross-section, islands 421 through 426 in FIG. 4 are shown conceptually and comprise regions in a device layer surrounded by isolating trenches extending down to a buried oxide layer, as previously shown and described in relation to exemplary island 330 in FIG. 3. The unique fabrication of the previously described embodiment of the invention's exemplary transistor 312 (or transistor 212) results in advantageous operation of high voltage circuits such as switching circuit 410. For example, various advantages of SOI structures are maintained, while circuit design is greatly simplified and enhanced.

Figure 5:
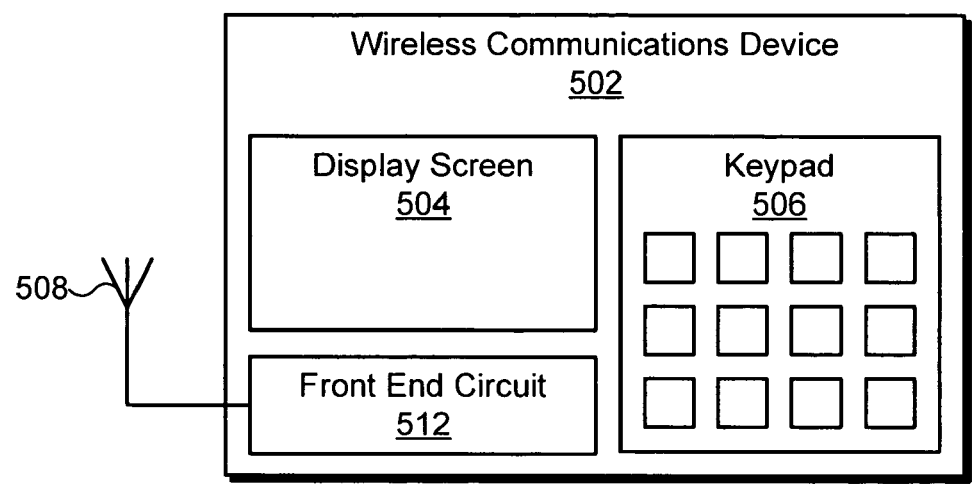
FIG. 5 shows an exemplary wireless communications device according to one embodiment of the present invention.
Figure 6:
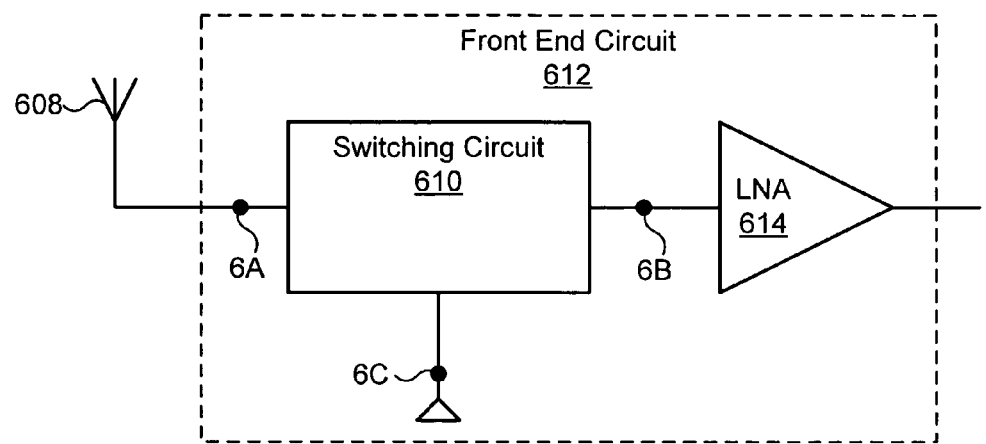
FIG. 6 shows an exemplary front end circuit according to one embodiment of the present invention.
Figure 7:
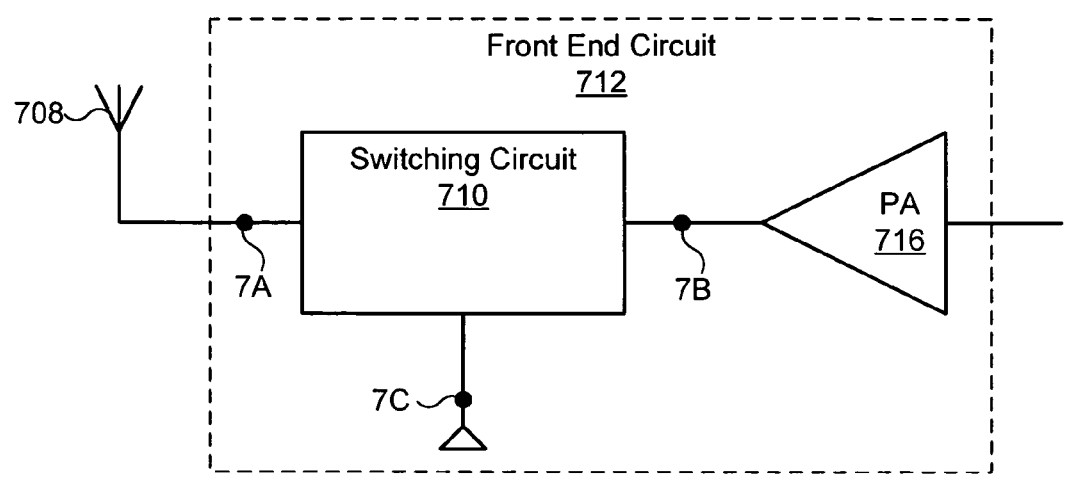
FIG. 7 shows an exemplary front end circuit according to one embodiment of the present invention.

In one embodiment of the present invention, one transistor is situated in each island, e.g. transistor 411 is fabricated in island 421, but in another embodiment more than one transistor can be situated in an island and/or wired in parallel, for greater total current carrying capacity of switching circuit 410. In other embodiments, switching circuit 410 may comprise fewer than six islands (e.g. one island) or greater than six. With six islands and six cascaded transistors, as shown in FIG. 4, signals as high as 30 volts can be controlled and applied between nodes 4A and 4B, while each transistor 411 through 416 experiences only about five volts of potential across its drain and source terminals within each respective island 421 through 426. Nodes 4A, 4B, and 4C can be coupled to, for example, an input, an output, and a switch control signal, respectively; the latter driving the gates of transistors 411 through 416 via resistors 431 through 436. FIGS. 5, 6, and 7 show an exemplary wireless communications device and "front end circuits" comprising a high voltage switching circuit such as switching circuit 410, as discussed further below.

FIG. 5 shows an exemplary wireless communications device 502, which can utilize circuits fabricated according to the present invention, such as switching circuit 410. Wireless communications device 502 can be, for example, a cellular telephone, a wireless personal computer, a wireless audio or video player, a wireless personal assistance device, or any other device configured for wireless communication. Exemplary wireless communications device 502 comprises display screen 504 and keypad 506, which in one embodiment may be an LCD screen and an alphanumeric keypad, for example. Wireless communications device 502 additionally comprises "front end circuit" (also referred to as "front end module") 512 coupled to antenna 508. While antenna 508 is depicted as an external antenna of wireless communications device 502, in one embodiment antenna 508 is an internal, i.e. integrated, antenna. Antenna 508 and front end circuit 512 may correspond to antenna 608 and front end circuit 612, shown in FIG. 6, or to antenna 708 and front end circuit 712, shown in FIG. 7.

As stated above, in one embodiment of wireless communications device 502, antenna 508 and front end circuit 512 correspond to antenna 608 and front end circuit 612, shown in FIG. 6. Front end circuit 612 comprises switching circuit 610 and low noise amplifier 614. Switching circuit 610 corresponds to switching circuit 410 in FIG. 4, i.e. it comprises a number of cascaded transistors and respective resistors coupled to nodes 6A, 6B, and 6C corresponding to nodes 4A, 4B, and 4C. Switching circuit 610 is coupled via node 6A to antenna 608, via node 6B to the input of low noise amplifier 614, and via node 6C to a switch control signal. Switching circuit 610 can be utilized, for example, to couple low noise amplifier 614 to antenna 608, under control of a switch control signal applied to node 6C, and to shield low noise amplifier 614 from high voltages experienced by antenna 608.

In another embodiment of wireless communications device 502, antenna 508 and front end circuit 512 correspond to antenna 708 and front end circuit 712, shown in FIG. 7. Front end circuit 712 comprises switching circuit 710 and power amplifier 716. In a manner similar to switching circuit 610, switching circuit 710 also corresponds to switching circuit 410 in FIG. 4, i.e. it can comprise a number of cascaded transistors and respective resistors coupled to nodes 7A, 7B, and 7C corresponding to nodes 4A, 4B, and 4C. Switching circuit 710 is coupled via node 7A to antenna 708, via node 7B to the output of power amplifier 716, and via node 7C to a switch control signal. Thus configured, the output of power amplifier 716 can switchably drive antenna 708 to transmit desired wireless signals, under control of a switch control signal coupled to node 7C. Node 7A could thus oscillate, for example, at 900 MHz, or 1.8 GHz, or other desired frequencies, especially at frequencies that are considered high frequencies suitable for wireless communications.

Switching circuit 410 can thus be utilized in front end circuit 512 of wireless communications device 502, configured in a manner corresponding to front end circuits 612 or 712. Notably, in one embodiment of the invention, wireless communications device 502 can comprise two front end circuits, configured respectively like front end circuits 612 and 712, coupled to a single antenna and individually controllable by respective switch control signals. FIGS. 5, 6, and 7 demonstrate merely examples of how an embodiment of the present invention's transistors and structures can be used in high voltage circuits, for example in switching circuit 410 in FIG. 4, and employed in actual devices.

The invention's advantages of, for example, a high resistivity bulk semiconductor layer, and thick device and buried oxide layers, each aid in implementing high performance circuits, such as switching circuit 410. An engineer using design methodologies suitable for conventional bulk semiconductor devices and circuits, without using specialized design techniques or device models required for conventional SOI technology, can readily design and implement high performance circuits utilizing various embodiments of the invention's SOI transistors and other SOI structures. One reason is that the invention's thick device layer semiconductor behaves substantially like a conventional bulk semiconductor, and conventional device models and computer simulation applications can be employed to design advantageous circuits utilizing the invention's SOI structures.

In addition to enabling use of bulk semiconductor device models and design methodologies, another advantage of the thick device layer in the invention's SOI structures is that the invention's wafer fabrication processes can be run and implemented in a bulk semiconductor factory, i.e. at the same time as bulk semiconductor wafers are processed and even in the same wafer lots. In contrast, using conventional SOI structure 100 in FIG. 1 to fabricate circuits would require more complex fabrication processes since the conventional SOI wafers typically cannot be fabricated using bulk semiconductor wafer processes or in the same wafer lots.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A switching circuit comprising:
   a plurality of cascaded transistors fabricated in a device layer situated over a buried oxide layer and a bulk semiconductor layer;

each of said plurality of cascaded transistors having a source/drain junction that does not contact said buried oxide layer, thereby forming a source/drain junction capacitance;

at least one trench extending through said device layer and contacting a top surface of said buried oxide layer, thereby electrically isolating at least one of said plurality of cascaded transistors in said switching circuit so as to reduce voltage and current fluctuations in said device layer.

2. The switching circuit of claim 1, wherein said at least one of said plurality of cascaded transistors is situated within an isolated island in said device layer.

3. The switching circuit of claim 1, wherein said plurality of cascaded transistors is situated within an isolated island in said device layer.

4. The switching circuit of claim 1, wherein said at least one of said plurality of cascaded transistors is an NFET with a gate driven by a switch control signal in a wireless communications device.

5. The switching circuit of claim 4, wherein said switch control signal drives said gate of said NFET through at least one resistor.

6. The switching circuit of claim 1, wherein said at least one of said plurality of cascaded transistors is a PFET with a gate driven by a switch control signal in a wireless communications device.

7. The switching circuit of claim 6, wherein said switch control signal drives said gate of said PFET through at least one resistor.

8. The switching circuit of claim 1, wherein a power amplifier in a wireless communications device provides an input to said switching circuit, and wherein an output of said switching circuit drives an antenna in said wireless communications device, and said switching circuit is controlled by a switch control signal in said wireless communications device.

9. The switching circuit of claim 8, wherein said wireless communications device is selected from the group consisting of a cellular telephone, a wireless personal computer, a wireless audio player, a wireless video player, and a wireless personal assistance device.

10. The switching circuit of claim 1, wherein an antenna in a wireless communications device provides an input to said switching circuit, and wherein an output of said switching circuit drives a low noise amplifier in said wireless communications device, and wherein said switching circuit is controlled by a switch control signal in said wireless communications device.

11. The switching circuit of claim 10, wherein said wireless communications device is selected from the group consisting of a cellular telephone, a wireless personal computer, a wireless audio player, a wireless video player, and a wireless personal assistance device.

12. A wireless communications device comprising a power amplifier and an antenna, said wireless communications device further comprising:

a switching circuit controlled by a switch control signal and interposed between said power amplifier and said antenna, said switching circuit including:

a plurality of cascaded transistors fabricated in a device layer situated over a buried oxide layer and a bulk semiconductor layer, each of said plurality of cascaded transistors having a source/drain junction that does not contact said buried oxide layer, thereby forming a source/drain junction capacitance;

at least one trench extending through said device layer and contacting a top surface of said buried oxide layer, thereby electrically isolating at least one of said plurality of cascaded transistors in said switching circuit so as to reduce voltage and current fluctuations in said device layer.

13. The wireless communications device of claim 12, wherein said at least one of said plurality of cascaded transistors is situated within an isolated island in said device layer.

14. The wireless communications device of claim 12, wherein said plurality of cascaded transistors is situated within an isolated island in said device layer.

15. The wireless communications device of claim 12, wherein said wireless communications device is selected from the group consisting of a cellular telephone, a wireless personal computer, a wireless audio player, a wireless video player, and a wireless personal assistance device.

16. A wireless communications device comprising an antenna and a low noise amplifier, said wireless communications device further comprising:

a switching circuit controlled by a switch control signal and interposed between said antenna and said low noise amplifier, said switching circuit including:

a plurality of cascaded transistors fabricated in a device layer situated over a buried oxide layer and a bulk semiconductor layer, each of said plurality of cascaded transistors having a source/drain junction that does not contact said buried oxide layer, thereby forming a source/drain junction capacitance;

at least one trench extending through said device layer and contacting a top surface of said buried oxide layer, thereby electrically isolating at least one of said plurality of cascaded transistors in said switching circuit so as to reduce voltage and current fluctuations in said device layer.

17. The wireless communications device of claim 16, wherein said at least one of said plurality of cascaded transistors is situated within an isolated island in said device layer.

18. The wireless communications device of claim 16, wherein said plurality of cascaded transistors is situated within an isolated island in said device layer.

19. The wireless communications device of claim 16, wherein said wireless communications device is selected from the group consisting of a cellular telephone, a wireless personal computer, a wireless audio player, a wireless video player, and a wireless personal assistance device.

* * * * *